(12) United States Patent
Prinz et al.

(10) Patent No.: US 11,108,411 B2
(45) Date of Patent: Aug. 31, 2021

(54) POLAR CODING WITH DYNAMIC FROZEN BITS

(71) Applicants: HUAWEI TECHNOLOGIES DUESSELDORF GMBH, Duesseldorf (DE); TECHNISCHE UNIVERSITÄET MÜENCHEN, Munich (DE)

(72) Inventors: Tobias Prinz, Munich (DE); Peihong Yuan, Munich (DE); Georg Boecherer, Munich (DE); Gerhard Kramer, Munich (DE); Onurcan Iscan, Munich (DE); Ronald Boehnke, Munich (DE); Wen Xu, Munich (DE)

(73) Assignees: Huawei Technologies Duesseldorf GmbH, Duesseldorf (DE); Technische Universität München, Munich (DE)

( * ) Notice: Subject to any disclaimer, the term of this patent is extended or adjusted under 35 U.S.C. 154(b) by 35 days.

(21) Appl. No.: 16/657,681

(22) Filed: Oct. 18, 2019

(65) Prior Publication Data
US 2020/0052718 A1 Feb. 13, 2020

Related U.S. Application Data

(63) Continuation of application No. PCT/EP2017/059179, filed on Apr. 18, 2017.

(51) Int. Cl.
*H03M 13/00* (2006.01)
*H03M 13/13* (2006.01)
*H03M 13/11* (2006.01)

(52) U.S. Cl.
CPC ....... *H03M 13/13* (2013.01); *H03M 13/1148* (2013.01); *H03M 13/616* (2013.01)

(58) Field of Classification Search
CPC ............. H03M 13/13; H03M 13/2906; H03M 13/3944; H04L 1/0041; H04L 1/0061
See application file for complete search history.

(56) References Cited

U.S. PATENT DOCUMENTS

| | | | | |
|---|---|---|---|---|
| 8,347,186 B1 * | 1/2013 | Arikan | ............... | H03M 13/1148 714/774 |
| 8,913,686 B2 * | 12/2014 | Barron | ............... | H03M 13/1102 375/295 |
| 9,164,835 B2 * | 10/2015 | Lee | ..................... | G06F 11/1072 |

(Continued)

OTHER PUBLICATIONS

"Channel coding for control channels," 3GPP TSG RAN WG1 Meeting #86, Gothenburg, Sweden, R1-167216, XP051142539, pp. 1-8, 3rd Generation Partnership Project, Valbonne, France (Aug. 22-26, 2016).

(Continued)

*Primary Examiner* — Esaw T Abraham
(74) *Attorney, Agent, or Firm* — Leydig, Voit & Mayer, Ltd.

(57) ABSTRACT

The present application concerns an encoding device comprising a FC 11 configured to generate m FC-output-bit-sequences by executing m polar encoding steps upon m FC-input-bit-sequences that comprise frozen and unfrozen bits, wherein m≥2. In an i-th polar encoding step of the m polar encoding steps at least one frozen bit is based on at least one unfrozen bit. The present application also concerns a decoding device comprising a processor configured to decode successively a polar-coded-bitstream comprising m-polar decoding steps, wherein m≥2. In an i-th polar decoding step of the m polar decoding steps at least one frozen bit is based on at least one unfrozen bit. Further, the present application concerns also correspondingly arranged encoding and decoding methods.

13 Claims, 4 Drawing Sheets

(56) References Cited

U.S. PATENT DOCUMENTS

| | | | | |
|---|---|---|---|---|
| 9,176,927 | B2 * | 11/2015 | Gross | H03M 13/617 |
| 9,362,950 | B2 * | 6/2016 | Wiley | H04L 1/00 |
| 9,467,164 | B2 * | 10/2016 | Ionita | H03M 5/18 |
| 9,628,114 | B2 * | 4/2017 | Huang | H04L 1/0057 |
| 9,819,361 | B2 * | 11/2017 | Shin | H03M 13/13 |
| 9,954,645 | B2 * | 4/2018 | Ahn | H04L 1/0009 |
| 10,461,779 | B2 * | 10/2019 | Hong | H04L 1/0067 |
| 2014/0019820 | A1 * | 1/2014 | Vardy | H03M 13/13 |
| | | | | 714/752 |
| 2015/0077277 | A1 * | 3/2015 | Alhussien | H04L 1/0057 |
| | | | | 341/67 |
| 2015/0295593 | A1 | 10/2015 | Trifonov et al. | |
| 2017/0149531 | A1 * | 5/2017 | Raza | H03M 13/37 |

OTHER PUBLICATIONS

"Details of the Polar code design," 3GPP TSG RAN WG1 Meeting #87, Reno, USA, R1-1611254, XP051175235, pp. 1-16, 3rd Generation Partnership Project, Valbonne, France (Nov. 10-14, 2016).

Tavildar "Bit-permuted Coded Modulation for Polar Codes," XP055390429, pp. 1-6 (Sep. 30, 2016).

Vangala et al., "A New Multiple Folded Successive Cancellation Decoder for Polar Codes," XP032694569, pp. 381-385 (2014).

Böcherer et al., "High Throughput Probabilistic Shaping with Product Distribution Matching," XP080748436, pp. 1-10, Institute of Electrical and Electronics Engineers, New York, New York (Feb. 24, 2017).

Böcherer et al., "Efficient Polar Code Construction for Higher-Order Modulation," XP033093159, pp. 1-6, Institute of Electrical and Electronics Engineers, New York, New York (2017).

* cited by examiner

POLAR CODING WITH DYNAMIC FROZEN BITS

CROSS-REFERENCE TO RELATED APPLICATIONS

This application is a continuation of International Application No PCT/EP2017/059179, filed on Apr. 18, 2017, the disclosure of which is hereby incorporated by reference in its entirety.

TECHNICAL FIELD

The present application is directed to an encoding device arranged to generate m polar-encoded output-bit-sequences by executing m polar encoding steps, wherein m is equal to or larger than two. Additionally, the present application is directed to a corresponding encoding method. The present application is further directed to a decoding device arranged to decode a polar-coded bit stream by executing m polar decoding steps. Additionally, the present application is directed to a corresponding decoding method.

BACKGROUND

Encoding becomes increasingly important in the communication technology. With the growing implementation of the communication technology in several areas of daily life, the security of data and of the transmission of data is of utmost importance. The devices, apparatuses, systems, involved in a communication process, have to be able to implement the encoding of data or information respectively in a fast and effective way and at the same time by avoiding encoding errors. High performance and high reliability are key features expected from encoding.

Recently, polar codes have been developed as a forward error correction (FEC) scheme. By use of polar codes, capacity of binary input discrete memoryless channels can be achieved. However, conventional encoders using polar code encoding are non-systematic, i.e. the input sequence of the encoder does not appear at the output of the encoder.

A systematic code is any error-correcting code, in which the input data, i.e. the information bits are embedded in the encoded output. Thus, the input sequence (i.e. the input data or information bits respectively) appears at the output of the encoder. Systematic codes have the advantage that the parity data or parity bits respectively can simply be appended to the source block, and receivers do not need to recover the original source symbols if received correctly. This is useful, for example, if error-correction coding is combined with a hash function for quickly determining the correctness of the received source symbols, or in cases where errors occur in erasures and a received symbol is thus always correct. Furthermore, for engineering purposes such as synchronization and monitoring, it is desirable to get reasonable good estimates of the received source symbols without going through the lengthy decoding process, which may be carried out at a remote site at a later time.

Further, if multistage decoding is desired, e.g., because of the advantage of improved performance and/or because of the advantage convenient unequal error protection (UEP), a systematic encoding is required.

Furthermore, systematic encoders are needed also if probabilistic shaping (PS) is considered and needed, e.g., because of the advantage of capacity increase. The technique of PS has gathered more interest in the last time particularly because of said advantage of capacity increase.

Additionally, in order to achieve the additive white Gaussian noise (AWGN) channel capacity, the transmit symbols should be Gaussian distributed, which can only be approximated in practical systems. The use of uniformly distributed quadrature amplitude modulation (QAM) symbols leads to a shaping loss of up to 1.53 dB for higher-order modulation. It can be shown that the shaping loss can be almost fully eliminated by use of probabilistic shaping, where QAM symbols follow an approximate discrete Gaussian distribution.

Polar codes are known as capacity-achieving codes with good performance. Thus, methods are required that allow an efficient encoding of polar codes, which is combinable with other applications such as the above mentioned higher order modulation with multi-stage decoding of bit-levels, PS etc. that require systematic encoding.

SUMMARY

Embodiments of the present application provide an improved encoding and decoding device and an improved encoding and decoding method. Particularly, embodiments of the present application provide a polar encoding device and method that uses multiple polar encoding steps, and a polar decoding device and method that uses multiple polar decoding step. These devices and methods should particularly be combinable with applications such as the above mentioned higher order modulation with multi-stage decoding of bit-levels, PS etc. that require systematic encoding.

Advantageous exemplary implementations of the present application are defined in the description and in the appended figures.

An idea of the present application is to provide encoding of m input-bit-sequences, e.g. a multi-level encoding with m encoding steps, in a systematic way by use of polar encoding. According to this idea of the present application, m input-bit-sequences are encoded successively, m being a larger than or equal to two (m≥2). By the encoding of the present application, preferably bits of data/information to be encoded appear at specific positions of a code word. Each one of the m input-bit-sequences is encoded by a polar code. The polar codes, which are used for the polar encoding of the m input-bit-sequences are preferably different. Thus, for each one of the m input-bit-sequences, a particular polar encoding block is used. The polar codes for the m input-bit-sequences are preferably jointly constructed, and the overall code is designed by a comprising frozen and unfrozen bits. The information to be transmitted is allocated on the unfrozen bits, and the frozen bits are preferably set to predefined values. The terms "unfrozen bits" and "frozen bits" are well known in the context of polar encoding.

In the above idea of the present application, at least in one polar encoding step at least one frozen bit is based on at least one unfrozen bit. This is referred to as "dynamic freezing". For example, an unfrozen bit used in one polar encoding block may be used as a frozen bit of the following polar encoding block.

According to a first aspect, an encoding device comprises a first encoder (FC) configured to generate m FC-output-bit-sequences by executing m polar encoding steps upon m FC-input-bit-sequences that comprise frozen and unfrozen bits, wherein m≥2, and wherein in an i-th polar encoding step of the m polar encoding steps at least one frozen bit is based on at least one unfrozen bit.

The encoding device of the first aspect thus uses dependent codes. These dependent codes are easier to decode, and decoding becomes more robust, because they are (partly) based on redundant information.

A "polar encoding step" means that an input-bit-sequence is processed by a single polar code in, for instance, a dedicated polar coding block of the FC. A polar code is executed on a set of input bits of the input-bit-sequence, the set comprising at least one frozen and at least one unfrozen bit.

In an implementation form of the first aspect, in the i-th polar encoding step at least one frozen bit of an i-th FC-input-bit-sequence is based on a j-th FC-input-bit-sequence, wherein $j<i$.

Accordingly, a sequential decoding becomes possible, because results of an earlier decoding step can be used for a later decoding step in, for instance, different polar decoding blocks of a decoding device.

In a further implementation form of the first aspect, $j=1$ and/or $j=i-1$.

In a further implementation form of the first aspect, the encoding device comprises a postcoder (LT) configured to map the m FC-output-bit-sequences by a linear transformation to m system-output-bit sequences.

The linear transformation can advantageously be used to obtain a Gray code sequence (for instance, by a label transformation).

In a further implementation form of the first aspect, the encoding device comprises a precoder (PC) configured to map a system-input-bit-sequence to the m FC-input-bit-sequences.

In a further implementation form of the first aspect, the PC comprises an inverse of the mapping of the FC-input-bit-sequence to FC-output-bit-sequence or the system-output-bit-sequence.

In a further implementation form of the first aspect, the PC is configured to map bits of the system-input-bit-sequence such that they appear at pre-defined positions in the m system-output-bit-sequences.

The pre-defined positions may be such that the bits of the system-input-bit-sequence appear in the same order in the system-output-bit-sequences.

In a further implementation form of the first aspect, the PC is configured to map the system-input-bit-sequence such that at least a subsequence of the sequence is comprised by the m system-output-bit-sequences.

Thereby, a complete and systematic mapping of, for instance, a PC-input-sequence to the m system-output-bit-sequences is possible.

In a further implementation form of the first aspect, the PC is configured to map bits of the system-input-bit-sequence such that parity bits appear at pre-defined positions, in particular of the m-th system-output-bit-sequence.

This allows for an efficient implementation of the mapping. In a further implementation according to the previous implementation form of the first aspect, the encoding device is configured to generate the parity bits by use of the m−1 encoded information-bit-sequences, encoded in the m−1 polar encoding steps, executed prior the m-th polar encoding step.

In a further implementation form of the first aspect, the encoding device comprises a shaping encoder (SC) configured to map an input-bit-sequence to the system-input-bit-sequence such that the system-input-bit-sequence is distributed non-uniformly.

This provides the advantages of probability shaping (systematic bit-sequences), and polar codes can accordingly be combined without the negative effects of conventional polar coding (e.g. non-systematic encoding).

In a further implementation form of the first aspect, the encoding device is configured to partition an unfrozen bit indices set of a first polar encoding step of the m polar encoding steps into m−1 sub-sets, wherein each one of the m−1 sub-sets is assigned to a corresponding i-th polar encoding step and has a size that is equal to a size of a frozen bit indices set of the i-th polar encoding step.

In a further implementation form according to the previous implementation form of the first aspect, the encoding device is configured to generate in the m-th polar encoding step the parity bits by: generating, for each i-th polar encoding step, a corresponding i-th bit vector by assigning to the corresponding i-th bit vector a polar transformation of an information bit sequence that is encoded in the (i−1)-th polar encoding step, and by combining, in the corresponding i-th bit vector, bits indicated in the sub-set assigned to the i-th polar encoding step and bits indicated in the frozen bit set of the i-th polar encoding step; and computing the encoded bit sequence of the m-th polar encoding step comprising the parity bits by executing a polar transform on a combination of all of the generated i-th bit vectors.

In a further implementation form of the first aspect, the encoding device is configured to generate in the m-th polar encoding step an encoded bit sequence that comprises parity bits and encoded information bits, and to generate in m−1 polar encoding steps, executed prior the m-th polar encoding step, m−1 encoded bit sequences, each representing an corresponding encoded information bit sequence.

In a further implementation form according to the previous implementation form of the first aspect, the encoding device is configured to generate in the m-th polar encoding step the encoded bit sequence based on the FC-input-bit-sequence.

In a further implementation form according to one of the two previous implementation forms, the encoding device is configured to partition an unfrozen bit indices set of a first polar encoding step of the m polar encoding steps into m sub-sets, wherein a first sub-set is assigned to a first polar encoding step of the m polar encoding steps and has a size that is equal to a number of encoded information bits to be transmitted in m-th encoding step; and each one of the m−1 sub-sets, following the first sub-set, is assigned to a corresponding i-th polar encoding step and has a size that is equal to a size of a frozen bit indices set of the i-th polar encoding step.

In a further implementation form according to the previous implementation form of the first aspect, the encoding device is configured to generate in the m-th polar encoding step the encoded bit sequence by: generating, for each i-th polar encoding step, a corresponding i-th bit vector by assigning to the corresponding i-th bit vector a polar transformation of an information bit sequence that is encoded in (i−1)-th polar encoding step, and by combining, in the corresponding i-th bit vector, bits indicated in the sub-set assigned to the i-th polar encoding step and bits indicated in the frozen bit set of the i-th polar encoding step; generating a further vector by combining bits indicated by the first sub-set in each one of information bit sequences encoded in the (i−1)-th polar encoding steps and information bits to be encoded in the m-th polar encoding step, and by executing a polar transform on the combined bits; and computing the encoded bit sequence of the m-th polar encoding step by executing a polar transform on a combination of all of the generated i-th bit vectors and the further vector.

According to a second aspect of the present application, an encoding method is provided that comprises generating, by a FC, m FC-output-bit-sequences by executing m polar encoding steps upon FC-input-bit-sequences that comprise frozen and unfrozen bits, wherein m≥2, and wherein in an i-th polar encoding step of the m polar encoding steps at least one frozen bit is based on at least one unfrozen bit.

According to a third aspect of the present application, a decoding device is provided that comprises a processor configured to decode successively a polar-coded-bitstream comprising m-polar decoding steps, wherein m≥2, and wherein in an i-th polar decoding step of the m polar decoding steps at least one frozen bit is based on at least one unfrozen bit.

The polar-coded bitstream is particularly a bitstream provided by an encoding device according to the first aspect as such or according to one of its implementation forms. The polar-coded bitstream may advantageously be based on the m FC-output-bit-sequences generated by said encoding device and may be the system-output-bit-sequences output by the encoding device.

In an implementation form of the third aspect, in the i-th polar decoding step the at least one frozen bit is based on at least one unfrozen bit of a j-th polar decoding step, wherein j<i.

In a further implementation form of the third aspect, j=1 and/or j=i−1.

According to a fourth aspect of the present application, a decoding method is provided that comprises decoding, by a processor, successively a polar-coded-bitstream comprising m-polar decoding steps, wherein m≥2; and wherein in an i-th polar decoding step of the m-polar decoding steps at least one frozen bit is based on at least one unfrozen bit.

BRIEF DESCRIPTION OF DRAWINGS

The above-described aspects and implementation forms of the present application will be explained in the following description of exemplary embodiments in relation to the enclosed drawings, in which.

DETAILED DESCRIPTION OF EMBODIMENTS

Generally, it has to be noted that all arrangements, devices, modules, components, models, elements, units, entities, and means and so forth described in the present application could be implemented by software or hardware elements or any kind of combination thereof. All steps which are performed by the various entities described in the present application as well as the functionality described to be performed by the various entities are intended to mean that the respective entity is adapted to or configured to perform the respective steps and functionalities. Even if in the following description of the specific embodiments, a specific functionality or step to be performed by a general entity is not reflected in the description of a specific detailed element of the entity which performs the specific step or functionality, it should be clear for a skilled person that these methods and functionalities can be implemented in respective hardware or software elements, or any kind of combination thereof. Further, the method of the present application and its various steps are embodied in the functionalities of the various described apparatus elements.

Moreover, any of the embodiments and features of any of the embodiments, described herein, may be combined with each other, unless a combination is explicitly excluded.

Figure 1:
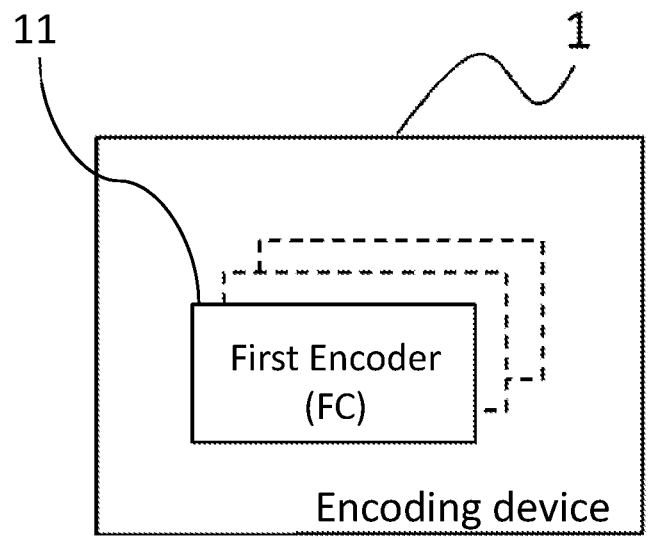
FIG. 1 shows an encoding device according to an exemplary embodiment of the present application.

FIG. 1 shows an encoding device 1 according to an exemplary embodiment of the present application. The encoding device 1 includes at least a first encoder (FC) 11. The at least FC 11 may include one or more processing entities (e.g., processors) that are arranged to execute encoding, respectively. For instance, a processing entity of the FC may be arranged to execute at least one polar encoding step.

The FC 11 of the device 1 is configured to generate m FC-output-bit-sequences by executing m polar encoding steps upon m FC-input-bit-sequences, which includes frozen and unfrozen bits. Thereby, m≥2. In particular, the FC 11 is configured such that in an i-th polar encoding step of the m polar encoding steps, at least one frozen bit is based on at least one unfrozen bit. Here, i may be equal to or larger than two, and equal to or smaller than m (i.e. i≤m).

The FC 11 of the encoding device 1 is preferably configured such that in the i-th polar encoding step, at least one frozen bit of an i-th FC-input-bit-sequence is based on a j-th FC-input-bit-sequence, wherein j<i. More preferably, j=1 and/or j=i−1.

Figure 2:
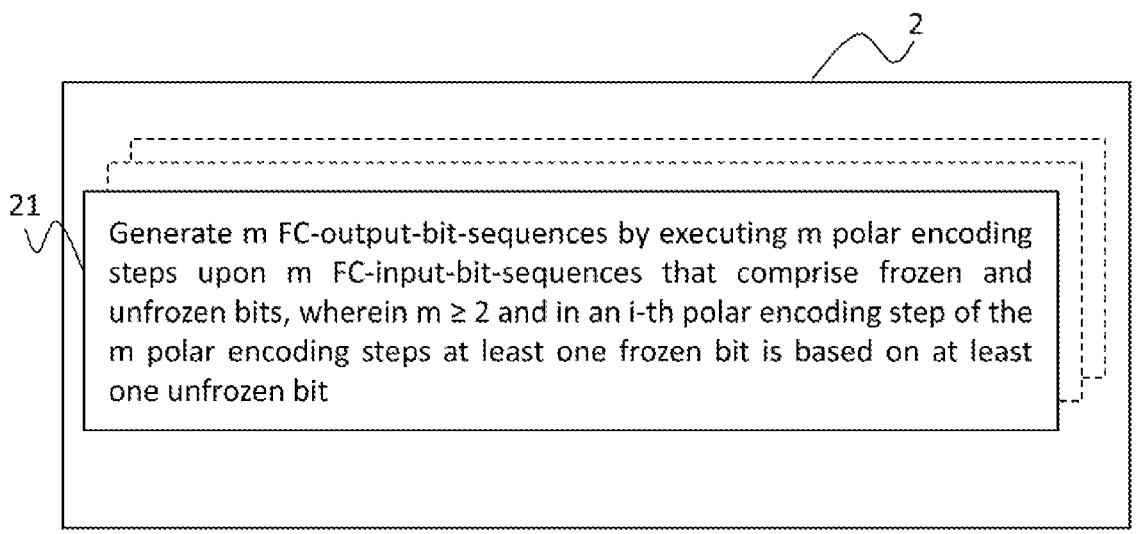
FIG. 2 shows steps of an encoding method according to an exemplary embodiment of the present application.

FIG. 2 shows steps of an encoding method 2 according to an exemplary embodiment of the present application. Generally, these steps of the encoding method 2 correspond to the actions executed by the encoding device 1. For example, the encoding device 1 (specifically the FC 11) executes the steps of the encoding method 2.

The encoding method 2 includes as step of generating m FC-output-bit-sequences by executing m polar encoding steps upon FC-input-bit-sequences, which includes frozen and unfrozen bits. Thereby, m≥2. In particular, in an i-th polar encoding step 21 of the m polar encoding steps, at least one frozen bit is based on at least one unfrozen.

The method 2 preferably includes that in the i-th polar encoding step 21, at least one frozen bit of an i-th FC-input-bit-sequence is based on a j-th FC-input-bit-sequence, wherein j<i. More preferably, j=1 and/or j=i−1.

The m FC-input-bit-sequences represent information sequences to be encoded. For each FC-input-bit-sequence, preferably a different polar code is used for the corresponding polar encoding step.

Figure 3A:
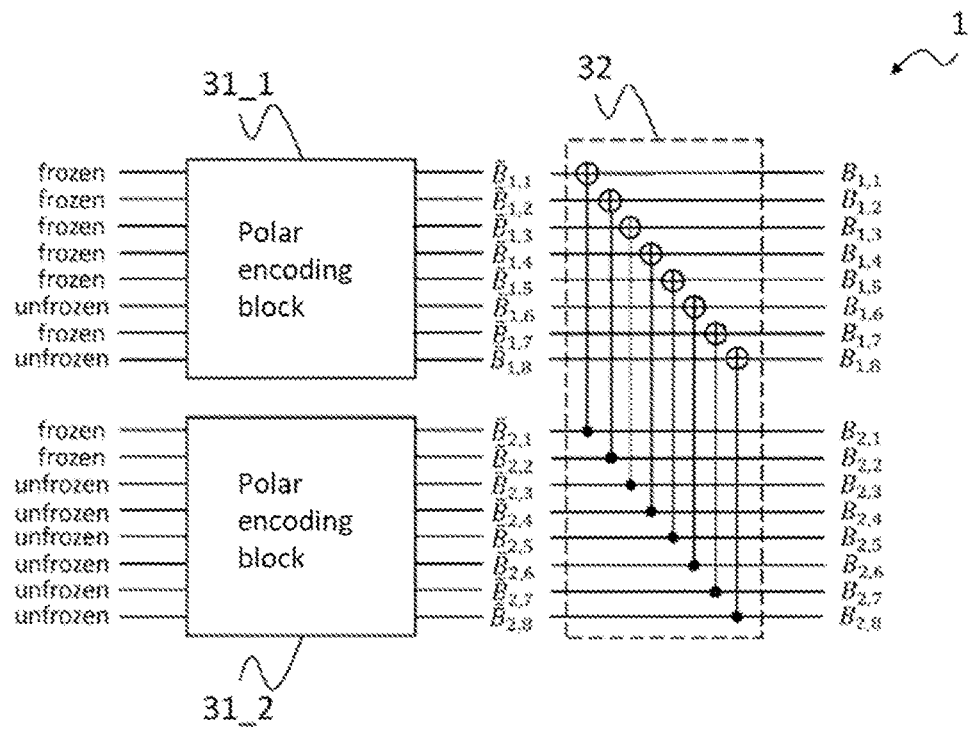
FIG. 3A shows an encoding device structure for 4-ASK.

FIG. 3A shows a structure of an encoding device 1 for a quaternary-amplitude-shift-keying (4-ASK) system. In FIG. 3A, particularly two polar encoding steps are provided as an example, i.e. here m=2. A first polar encoding step (i.e. an encoding step of a $1^{st}$ FC-input-bit-sequence) is executed by a first polar encoding block 31_1 of a FC 11, and a second polar encoding step (i.e. an encoding of a $2^{nd}$ FC-input-bit-sequence) is executed by a second polar encoding block 31_1 of preferably the same FC 11. The two FC-input-bit-sequences both include frozen and unfrozen bits. As is generally known for polar encoding, the unfrozen bits represent "information bits" of the input or information sequence, respectively, to be encoded.

After the execution of the polar encoding steps at the polar encoding blocks 31_1, 31_2, respectively, encoded bits $\tilde{B}_{1,1}$ to $\tilde{B}_{1,8}$ and $\tilde{B}_{2,1}$ to $\tilde{B}_{2,8}$ are obtained. The encoding device 1 of FIG. 3A is then further configured to apply a least significant bit (LSB) gray labeling for encoding, which is executed via a linear transform. This is indicated in FIG. 3A by postcoder block 32, also called linear transformer (LT). Generally, the postcoder block 32 is configured to map the m FC-output-bit-sequences by a linear transformation to m system-output-bit sequences. The LSB gray labeling is related to set partitioning (SP) labeling via a linear transformation. Thus, the operation between the bits $\tilde{B}_{1,1}$ to $\tilde{B}_{1,8}$, $\tilde{B}_{2,1}$ to $\tilde{B}_{2,8}$ and the bits $B_{1,1}$ to $B_{1,8}$, $B_{2,1}$ to $B_{2,8}$ resulting from the LSB gray labeling is the label transform for obtaining the LSB Gray labeling.

Figure 3B:
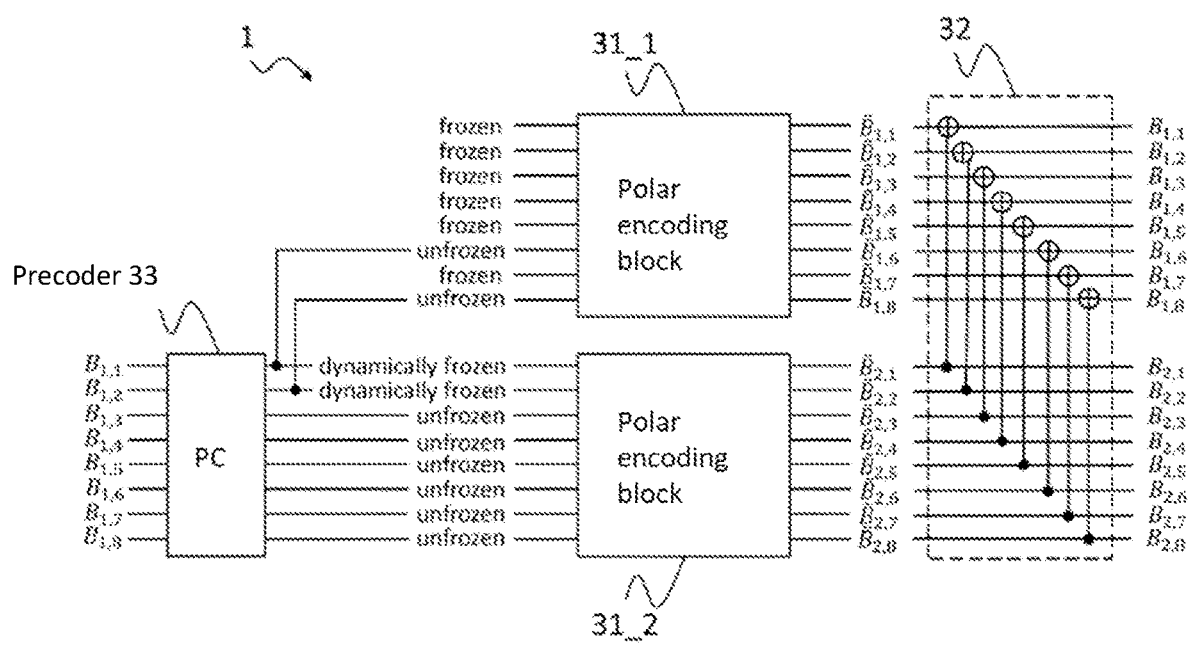
FIG. 3B shows an exemplary structure of the encoding device according to an embodiment of the present application.

FIG. 3B shows an exemplary structure of an encoding device 1 according to an exemplary embodiment of the present application, which bases on the structure of the encoding device 1 shown in FIG. 3A. In the encoding device 1 of FIG. 3B, in the second polar encoding step of the m=2 polar encoding steps, two frozen bits are based on two unfrozen bits. Specifically, the two frozen bits of $2^{nd}$ FC-input-bit-sequence are based on the $1^{st}$ FC-input-bit-sequence.

In particular, so-called dynamically frozen bits are used in the second polar encoding step, wherein a dynamically frozen bit is a frozen bit that bases on at least one unfrozen bit. Here, in the second polar encoding step at the polar encoding block 31_2, the frozen bits are "dynamically frozen" according to the unfrozen bits in the first polar encoding step at the polar encoding block 31_1. Due to this implementation, and the resulting dependency introduced into the polar encoding, a decoding of the polar-coded bitstream output from the encoding device 1 is easier and more robust, because the codes are partly based on redundant information. Further, this allows also performing efficiently a matrix inversion, which is explained in the following.

Because it is desired that systematic bits appear in the first polar encoding step, and the parity bits appear in the second polar encoding step, the encoding device 1 of FIG. 3B includes preferably a precoder (PC) 33. The PC 33 is configured to map a system-input-bit-sequence (i.e. a bit-sequence input into the encoding device 1 as a whole) to the m FC-input-bit-sequences. By the precoder 33, the mapping of the unfrozen bits is inverted to the first encoding step, which corresponds to a matrix inversion operation. To this end, the mapping of the PC 33 includes an inverse of the mapping of the FC-input-bit-sequences to the FC-output-bit-sequences (output by the FC 11) or to system-output-bit-sequences (output by the encoding device 1 as a whole), respectively.

Generally, the PC 33 is selected such that it is configured to map bits of the system-input-bit-sequence such that they appear at pre-defined positions in the m system-output-bit-sequences. Preferably, such that it is configured to map the system-input-bit-sequence such that at least a subsequence of the sequence is included by the m system-output-bit-sequences. More preferably such that it is configured to map bits of the system-input-bit-sequence such that parity bits appear at pre-defined positions, in particular of the m-th system-output-bit-sequence.

According to an exemplary embodiment, the precoding operation of the PC 33 is a multiplication of an input sequence with a matrix A, which is an inverse of matrix B, wherein the matrix B is a matrix that describes a mapping from unfrozen bits of each one of the m-th polar encoding steps and dynamical frozen bits of each one of m-th polar encoding steps to systematic bit positions in the output after the label transform.

Figure 4A:
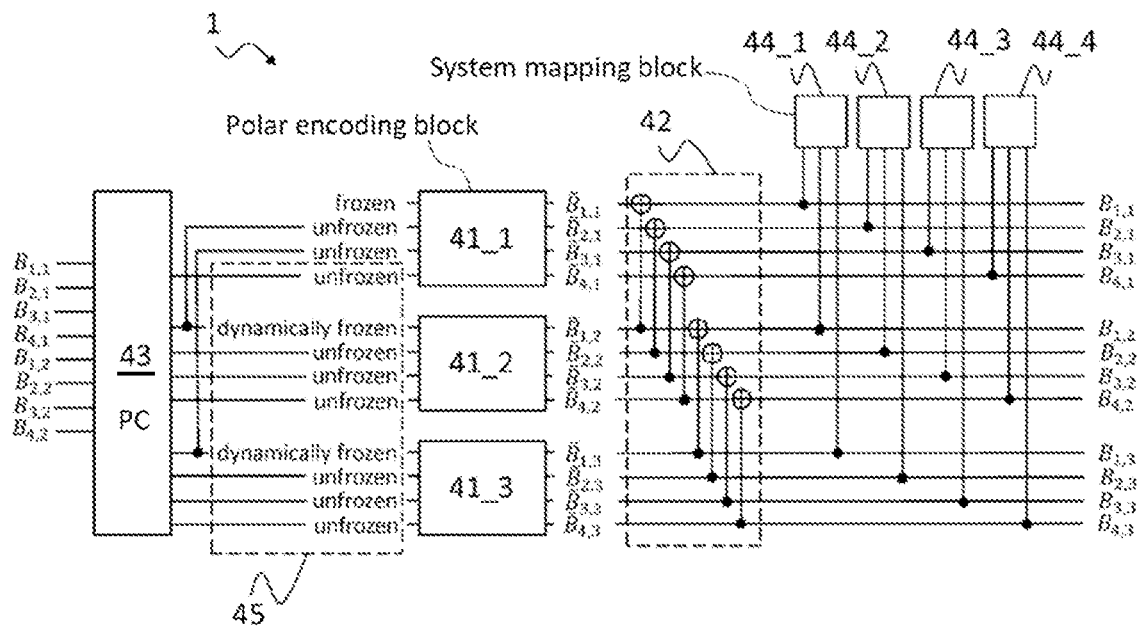
FIG. 4A shows a further exemplary structure of the encoding device according to an exemplary embodiment of the present application.

FIG. 4A shows a further exemplary structure of the encoding device 1 according to an exemplary embodiment of the present application. The structure of the encoding device 1 is based on the the structure shown in FIG. 3B. The encoding device 1 of FIG. 4A is exemplarily configured to carry out three polar encoding steps at three polar encoding blocks 411, 41_2, 41_3 of the FC 11, respectively. That is, three FC-input-bit-sequences are encoded, respectively, i.e. m=3. First of all, a precoding operation is executed by a precoder 43 on a system-input-bit-sequence, in order to obtain three FC-input-bit-sequences prior to the polar encoding blocks 411, 41_2, 41_3 respectively.

According to the FC-input-bit-sequences output of the precoder 43, values of the unfrozen bits of the first encoding step are preselected, and the frozen bits of the other polar encoding steps are dynamically frozen according to the unfrozen values of the first encoding step. This is shown in FIG. 4A by the box 45.

The values of the dynamically frozen bits are selected such that each dynamically frozen bit equals to an unfrozen bit from the first level. Which dynamically frozen bit takes the values of which unfrozen bit is explained in detail hereinafter with sets $U_1$, $U_{1,m}$, $U_{2,m}$, . . . .

The outputs by three polar encoding blocks 41_1, 41_2, 41_3, i.e. the three FC-output-bit-sequences, are further mapped by a linear transformation to the m system-output-bit sequences in postcoder block 42, also called linear transformer (LT). Particularly, the FC-output-bit-sequences are converted to gray labeling in postcoder block 42. This is done by use of a label transform. According to the present embodiment, the label transform of postcoder block 42 is defined exemplary as follows:

$$[B_1, B_2, \ldots, B_m] = [\tilde{B}_1, \tilde{B}_2, \ldots, \tilde{B}_m] \underbrace{\begin{bmatrix} 1 & 0 & 0 & \ldots & 0 & 0 \\ 1 & 1 & 0 & \ldots & 0 & 0 \\ 0 & 1 & 1 & \ldots & 0 & 0 \\ \vdots & & \ddots & & \vdots \\ 0 & 0 & 0 & \ldots & 1 & 1 \end{bmatrix}}_{=:L_m}$$

Finally, a symbol mapping may executed by symbol mapping blocks 44_1 to 44_4 of the encoding device 1. The symbol mapping is executed as generally known, i.e. by mapping all encoded bits of a polar encoding block 411, 41_2, 41_3 to symbols. In FIG. 4A, each one of the symbol mapping blocks 44_1 to 444 maps all encoded bits of a corresponding polar encoding block 411, 41_2, 41_3 symbols.

Figure 4B:
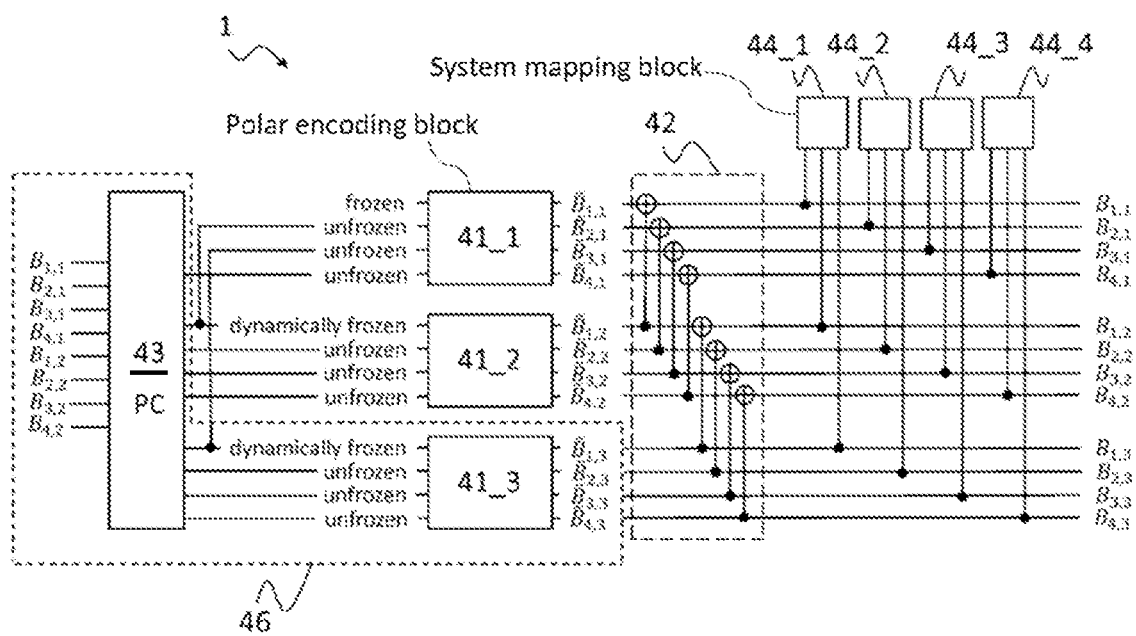
FIG. 4B shows a further exemplary structure of the encoding device according to an exemplary embodiment of the present application.

FIG. 4B shows a further exemplary structure of the encoding device 1 according to exemplary an embodiment of the present application. The structure of the encoding device 1 is based on the structure shown in FIG. 4A.

Similarly to the encoding device 1 of FIG. 4A, also in the encoding device 1 of FIG. 4B three polar encoding steps are carried out, i.e. three FC-input-bit-sequences, respectively, are encoded, i.e. m=3. First of all, a precoding operation is again executed prior the polar encoding steps in the blocks 411, 41_2, 41_3. The precoder 43 inverts the mapping of the system-input-bit-sequence to the system-output-bit-sequences, which corresponds to a matrix inversion operation.

Since in this embodiment, the system input bit sequence should appear in the system output bit sequence, calculation of only a part of the system output bit sequence is enough (which correspond to $\tilde{B}_{1,3}$ to $\tilde{B}_{4,3}$ in FIG. 4B). This corresponds to only perform calculations regarding the outputs $\tilde{B}_{1,3}$ to $\tilde{B}_{4,3}$ shown in box 46, the rest of the system output sequence can be taken from the system-input-bit-sequence.

Finally, a symbol mapping is executed by the symbol mapping blocks 44_1 to 44_4. The symbol mapping is executed by mapping all encoded bits of a polar encoding block 41_1, 41_2, 41_3 to symbols. In FIG. 4B, each one of the symbol mapping blocks 44_1 to 444 maps all encoded bits of a corresponding polar encoding block 411, 41_2, 41_3 to symbols.

In the following, two more exemplary embodiments that are based on the aforesaid will be presented. The two more exemplary embodiments are executable by the encoding device 1 and/or via the encoding method 2. Here, the encoding device 1 includes a shaping encoder (SC) configured to map an input-bit-sequence to the system-input-bit-sequence such that the system-input-bit-sequence is distributed non-uniformly.

In the first more specific embodiment, a systematic polar encoding is implemented for probabilistic amplitude shaping (PAS). In this PAS scheme with m different polar encoding steps, a channel code of rate R=(m−1)/m is used with the systematic encoding device 1. According to the first specific embodiment, the first m−1 polar encoding steps are used to transmit systematic bits, and the last polar encoding step is used to transmit parity bits $b_m$. The following steps are executed for systematic encoding according to the first more specific embodiment.

At first, the following sets are defined:

$U_1$: set of indices of unfrozen bits within a first polar code used by the first polar encoding blocks 31_1, 41_1 or used in the first polar encoding step 21, respectively.

$F_2, \ldots, F_m$: set of indices of frozen bits within the $2^{nd}, \ldots$, m-th polar codes, corresponding to the $2^{nd}, \ldots$, m-th polar encoding blocks 31_2, 41_2, 41_3 or used in the $2^{nd}, \ldots$, m-th polar encoding steps 21, respectively. Here, it has to be noted that the m-th polar encoding step is the encoding step corresponding to the parity bits $b_m$, i.e. that in the m-th polar encoding step 21 parity bits $b_m$ only are generated.

$b_1, \ldots, b_{m-1}$ input information sequences (and hence systematic bits) for polar encoding steps 1 to m−1 or for $1^{st}$ to (m−1)-th polar encoding step 21, respectively.

Secondly, the set $U_1$ is partitioned into sub-sets $U_{1,2}, \ldots, U_{1,m}$ such that:

$|U_{1,2}|=|F_2|$ $\ldots$ $|U_{1,m}|=|F_m|$

According to an embodiment, the actual partitioning of $U_1$ is arbitrary.

Thus, the unfrozen bit indices set $U_1$ of the first polar encoding step 21 or of the first encoding block 311, respectively, is partitioned into m−1 sub-sets $U_{1,2}, \ldots, U_{1,m}$, wherein each one of the m−1 sub-sets $U_{1,2}, \ldots, U_{1,m}$ is assigned to a corresponding i-th polar encoding step or polar encoding block, respectively (i=2, ..., m, i.e. 2≤i≤m).

Thirdly, the following procedure is used exemplary according to the first more specific embodiment to generate the parity bits $b_m$ from the information bits $b_i$:

```
1: procedure ENCODE(b_1, ..., b_{m-1})
2:     for i = 2, ... m do
3:         a_i ← polar transform of b_{i-1}
4:         for j = i, ..., m do
5:             a_{i,u_1,j} ← a_{i,u_1,j} ⊕ a_{i,Fj}
6:         end for
7:     end for
8:     a ← a_2 ⊕ a_3 ⊕ ... ⊕ a_m
9:     b_m ← polar transform of a
10:    return b_m
11: end procedure
```

This procedure is an efficient implementation of the box 46, assuming the dynamically frozen bits are selected according to the defined sets. The input is the system-input-bit-sequence and output is the parity bits of the system-output-bit-sequence. By combining the output of this procedure with the input sequence (which corresponds to the systematic part of the system-output-bit-sequence), one gets the whole system output sequence.

The procedure basically performs a 'multiplication with an inverse matrix (box 43)' in an efficient way, followed by a last polar transform (which corresponds to the block 41_3). Note that the efficient 'multiplication with an inverse matrix' is performed by using polar transforms in a successive manner.

Here, bits in sub-sets $U_{1,j}$ are used for dynamically freezing the bits in the j-th polar encoding step, wherein 2≤j≤m.

Thus, in the m-th polar encoding step, the parity bits $b_m$ are generated by: generating, for each i-th polar encoding step a corresponding i-th bit vector $a_i$ by assigning to the corresponding i-th bit vector $a_i$ a polar transformation of an information bit sequence that is encoded in (i−1)-th polar encoding step, and by combining, in the corresponding i-th bit vector $a_i$, bits indicated in the sub-set assigned to the i-th polar encoding step and bits indicated in the frozen bit set of the i-th polar encoding step or bit-level respectively; and computing the encoded bit sequence $b_m$ of the m-th polar encoding step including the parity bits $b_m$ by executing a polar transform on a combination of all of the generated i-th bit vectors $a_i$.

Fourthly, the parity bits $b_m$ (generated in the m-th bit-level or in the m-th polar encoding step respectively) are appended to the systematic bits $b_1, b_2, \ldots, b_{m-1}$ (generated in the $1^{st}$ to (m−1)-th polar encoding steps).

In the second more specific embodiment, a systematic polar encoding is implemented for extended PAS in the systematic encoding device 1. The extended PAS scheme of the second more specific embodiment is a modified scheme of the first more specific embodiment. I.e. the second more specific embodiment is based on the first more specific embodiment and represents a modification of the first more specific embodiment. The extended PAS scheme has m different polar encoding blocks 31_1, 31_2, 41_1, 41_2, 241_3 or m different polar encoding steps 21 respectively. I.e. the extended PAS scheme has m input/information sequences respectively. Further, the extended PAS scheme has a channel code of rate R that is larger than (m−1)/m. According to the second specific embodiment, the first m−1 polar encoding steps are used to transmit systematic bits, and the last polar encoding step is used to transmit parity bits and also systematic bits. The following steps are executed for systematic encoding according to the second more specific embodiment.

Firstly, the sets $U_1$ and $F_2, \ldots, F_m$ and $b_1, b_2, \ldots, b_{m-1}$ are defined in the same way as in the first more specific embodiment. In addition, u is defined as sequence including information bits to be transmitted with the same polar encoding step as the parity bits being the m-th polar encoding step.

Secondly, the set $U_1$, including indices of unfrozen bits within the first polar code, is partitioned into sub-sets $U_{1,1}$, $U_{1,2}, \ldots, U_{1,m}$, such that:

$|U_{1,1}|=g$ ($g$ is the length of the sequence $u$)

$|U_{1,2}|=|F_2|$ $\ldots$ $|U_{1,m}|=|F_m|$ $i_1<i_2<\ldots<i_m \forall i_1 \in U_{1,1}, \forall i_2 \in U_{1,2}, \ldots, \forall i_m \in U_{1,m}$ Particularly, partition an unfrozen bit indices set $U_1$ of a first polar encoding step of the m polar encoding steps into m sub-sets is executed such that: a first sub-set $U_{1,1}$ is assigned to a first polar encoding step of the m polar encoding steps and has a size that is equal to a number of encoded information bits to be transmitted in m-th encoding step or bit-level respectively; and each one of the m−1 sub-sets $U_{1,2}, \ldots, U_{1,m}$, following the first sub-set $U_{1,1}$, is assigned to a corresponding i-th polar encoding step has a size that is equal to a size of a frozen bit indices set of the i-th polar encoding step.

Thirdly, the following procedure is used exemplary according to the second more specific embodiment to generate parity bits from data/information bits $b_i$ and u:

```
 1: procedure ENCODE(b₁, ..., b_{m-1}, u)
 2:     c ← array of size n_c initialized with zeros
 3:     for i = 2, ... m do
 4:         a_i ← polar transform of b_{i-1}
 5:         for j = i, ..., m do
 6:             a_{i,u₁,j} ← a_{i,u₁,j} ⊕ a_{i,Fj}
 7:         end for
 8:         c_{u₁,1} ← c_{u₁,1} ⊕ b_{i-1,u₁,1}
 9:     end for
10:     c_{u₁,1} ← c_{u₁,1} ⊕ u
11:     c ← polar transform of c
12:     a ← a₂ ⊕ a₃ ⊕ ... ⊕ a_m ⊕ c
13:     b_m ← polar transform of a
14:     return b_m
15: end procedure
```

Similar to the first more specific embodiment, this procedure is an efficient implementation of box 46 for extended PAS. Instead of using block 43 (multiplication with an inverse matrix), m polar transforms and the LT, this procedure generates the parity part of the system output bit sequence for extended PAS by using m polar transforms and some linear operations.

Similarly to the first more specific embodiment, in the second more specific embodiment bits in $U_{1,j}$ are particularly used for dynamically freezing the bits in the j-th polar encoding step.

Thus, in the m-th polar encoding step the encoded bit sequence $b_m$, including both parity bits and information bits, is generated by the execution of the following steps. For each i-th polar encoding step, a corresponding i-th bit vector $a_i$ is generated by assigning to the corresponding i-th bit vector $a_i$ a polar transformation of an information bit sequence that is encoded in (i−1)-th polar encoding step, and by combining, in the corresponding i-th bit vector $a_i$, bits indicated in the sub-set assigned to the i-th polar encoding step and bits indicated in the frozen bit set of the i-th polar encoding step. Then, a further vector c (consisting of zeros first, i.e. at the time of the initiation of the further vector c) is generated by: establishing the further vector c with bits of the first sub-set $U_1$; for each i, combining bits of the further vector c with a combination of bits of (i−1)-th information bit sequence of (i−1)-th polar encoding step, said (i−1)-th information bit sequence corresponding to frozen bit set of the i-th encoding step, and information bits to be encoded in m-th polar encoding step; and executing a polar transform on the further vector c. Subsequently, the encoded bit sequence $b_m$ of the m-th polar encoding step is computed by executing a polar transform on a combination of all of the generated i-th bit vectors $a_i$ and the further vector c.

Fourthly, the encoded bit sequence $b_m$ of the the m-th polar encoding step is appended or added to the systematic bits.

Figure 5:
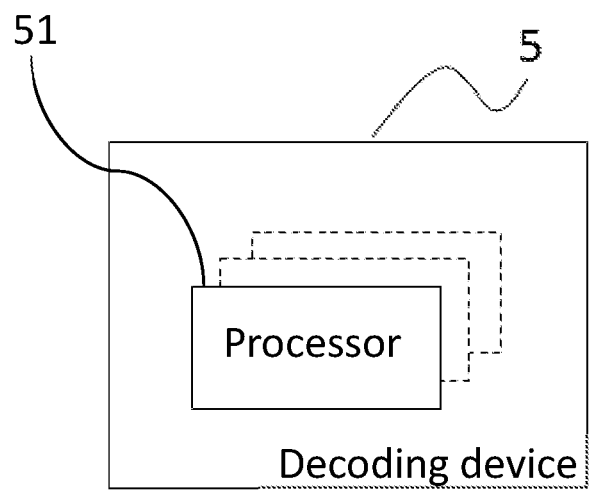
FIG. 5 shows a decoding device according to an exemplary embodiment of the present application.

In view of the aforesaid, the present application relates also to a decoding device 5 as shown in FIG. 5. The decoding device 5 including at least one processor 51 configured to decode successively a polar-coded-bitstream including m-polar decoding steps, wherein m≥2. Similar to the encoding steps in the encoding device 1, also in an i-th polar decoding step of the m polar decoding steps at least one frozen bit is based on at least one unfrozen bit. The decoding device 5 preferably decodes as the polar-coded bitstream a system-output-bit-sequence of the encoding device 1.

Figure 6:
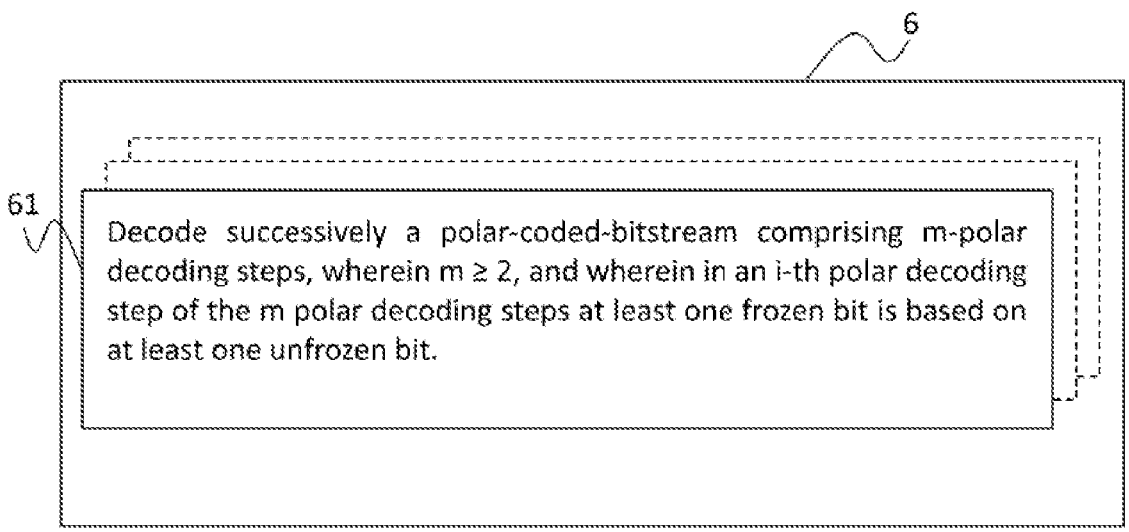
FIG. 6 shows steps of a decoding method according to an exemplary embodiment of the present application.

Accordingly, a decoding method 6, which is shown in FIG. 6, includes at least one step 61 of decoding, by a processor 51, successively a polar-coded-bitstream including m-polar decoding steps, wherein m≥2. In an i-th polar decoding step of the m-polar decoding steps at least one frozen bit is based on at least one unfrozen bit.

By the present application an efficient encoding device and an efficient encoding method are provided that have an improved performance, provide capacity-achieving codes, and are utilizable in different applications, e.g. also in applications requiring systematic encoding.

The application has been described in conjunction with various embodiments herein. However, other variations to the enclosed embodiments can be understood and effected by those skilled in the art and practicing the claimed application, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. An encoding device, comprising:
an encoder configured to generate m number of FC-output-bit-sequences by executing m number of polar encoding steps upon m number of FC-input-bit-sequences, respectively, wherein each FC-input-bit-sequence of the m number of FC-input-bit-sequences comprises frozen bits and unfrozen bits,
wherein m is an integer value and m≥2,
wherein one of the m number of polar encoding steps is denoted as an i-th polar encoding step, and another one of the m number of polar encoding steps other than the i-th polar encoding step is denoted as a j-th polar encoding step, and wherein the j-th polar encoding step is performed prior to the i-th polar encoding step,
wherein the i-th polar encoding step corresponds to an i-th FC-input-bit-sequence,
wherein the j-th polar encoding step corresponds to a j-th FC-input-bit-sequence, and wherein at least one frozen bit of the i-th FC-input-bit-sequence is based on at least one unfrozen bit of the j-th FC-input-bit-sequence.

2. The encoding device of claim 1, wherein j=1 and/or j=i−1.

3. The encoding device of claim 1, further comprising:
a postcoder configured to map the m FC-output-bit-sequences by a linear transformation to m system-output-bit sequences.

4. The encoding device of claim 3, further comprising:
a precoder configured to map a system-input-bit-sequence to the m FC-input-bit-sequences.

5. The encoding device of claim 4, wherein the precoder comprises an inverse of the mapping of the m FC-input-bit-sequences to the m FC-output-bit-sequences or them system-output-bit-sequences.

6. The encoding device of claim 5, wherein the precoder is configured to map bits of the m system-input-bit-sequences such that they appear at pre-defined positions in the m system-output-bit-sequences.

7. The encoding device of claim 5, wherein the precoder is configured to map the m system-input-bit-sequences such that at least a subsequence of the m system-input-bit-sequences is comprised by the m system-output-bit-sequences.

8. The encoding device of claim 7, wherein the precoder is configured to map bits of the system-input-bit-sequence such that parity bits appear at pre-defined positions.

9. The encoding device of claim 8, further comprising:
a shaping encoder configured to map an input-bit-sequence to the system-input-bit-sequence such that the system-input-bit-sequence is distributed non-uniformly.

10. The encoding device of claim 8, wherein the pre-defined positions are in the m-th system-output-bit-sequence.

11. An encoding method, comprising:
generating, by an encoder, m number of FC-output-bit-sequences by executing m number of polar encoding steps upon m number of FC-input-bit-sequences, respectively, wherein each FC-input-bit-sequence of the m number of FC-input-bit-sequences comprises frozen bits and unfrozen bits,
wherein m is an integer value and m≥2,
wherein one of the m number of polar encoding steps is denoted as an i-th polar encoding step, and another one of the m number of polar encoding steps other than the i-th polar encoding step is denoted as a j-th polar encoding step, and wherein the j-th polar encoding step is performed prior to the i-th polar encoding step,
wherein the i-th polar encoding step corresponds to an i-th FC-input-bit-sequence,
wherein the j-th polar encoding step corresponds to a j-th FC-input-bit-sequence, and
wherein at least one frozen bit of the i-th FC-input-bit-sequence is based on at least one unfrozen bit of the j-th FC-input-bit-sequence.

12. A decoding device, comprising:
a processor configured to decode successively a polar-coded-bitstream comprising m number of polar decoding steps,
wherein m is an integer value and m≥2,
wherein one of the m number of polar encoding steps is denoted as an i-th polar encoding step, and another one of the m number of polar encoding steps other than the i-th polar encoding step is denoted as a j-th polar encoding step, and wherein the j-th polar encoding step is performed prior to the i-th polar encoding step,
wherein at least one frozen bit in the i-th polar decoding step is based on at least one unfrozen bit in the j-th polar decoding step.

13. The decoding device according to claim 12, wherein j=1 and/or j=i−1.

* * * * *